United States Patent [19]
Hartman

[11] Patent Number: 5,253,328
[45] Date of Patent: Oct. 12, 1993

[54] NEURAL-NETWORK CONTENT-ADDRESSABLE MEMORY

[75] Inventor: Eric J. Hartman, Austin, Tex.

[73] Assignee: Microelectronics & Computer Technology Corp., Austin, Tex.

[21] Appl. No.: 439,124

[22] Filed: Nov. 17, 1989

[51] Int. Cl.[5] .......................................... G06F 15/46
[52] U.S. Cl. ...................................... 395/24; 395/23; 365/49
[58] Field of Search ............... 364/807, 200, 900, 513; 307/201; 377/2; 365/49; 395/23, 24

[56] References Cited

U.S. PATENT DOCUMENTS

| | | | |
|---|---|---|---|
| 4,660,166 | 4/1987 | Hopfield | 364/807 |
| 4,719,591 | 1/1988 | Hopfield et al. | 364/807 |
| 4,897,811 | 1/1990 | Scofield | 364/900 |
| 4,901,271 | 2/1990 | Graf | 364/807 |

OTHER PUBLICATIONS

Rumelhart et al., Parallel Distributed Processing vol. 1: Foundations, 1986, MIT Press, pp. 282-314.
Hopfield, J. J., "Neurons with graded response have collective computational properties like those of two-state neurons", Proc. Natl. Acad. Sci., vol. 81, pp. 3088-3092 (1984).
Van Den Bout et al., "Graph Partitioning Using Annealed Neural Networks", IEEE Trans. on Neural Networks, Jun. 1990, pp. 192-203.
Almeida, L. B., "A learning rule for asynchronous perceptrons with feedback in a combinatorial environment", IEEE First Intl. Conf. on Neural Networks, vol. II, Jun. 1987, pp. 609-618.
Hartman, E., "A high storage capacity neural network content-addressable memory", Network, 1991, 315-334.
Alspector et al., "Performance of a stochastic learning microchip", from Advances in Neural Information Processing Systems I, Morgan-Kaufmann, 1989, pp. 748-760.
Cortes et al., "A Network System for Image Segmentation", Intl. Conf. Neural Networks, 1989, pp. 121-125.
Bilbro et al., "Optimization by Mean Field Annealing", from Advances in Neural Information Processing Systems I, Morgan-Kaufmann, 1989, pp. 91-98.
Ogura et al., "A 20-Kbit Associative Memory LSI for Artificial Intelligence Machines", IEEE Jou. Solid-State Circuits, vol. 24(4), Aug. 1989, pp. 1014-1020.
Peterson and Hartman, "Explorations of Mean-Field Theory Learning Algorithm," MCC-ACA-ST/HI-06-5-88, Microelectronics and Computer Technology Corporation (1988).
Hopfield and Tank, "Computing with Neural Circuits: A Model," Science vol. 233, pp. 622-633 (1986).
Hopfield, "Neural Networks and Physical Systems with Emergent Collective Computational Abilities", Proceedings of the National Academy of Science, U.S.A., vol. 79, pp. 2554-2558 (1982).
Crick and Mitchison, "The Function of Dream Sleep," Nature, vol. 34, pp. 111-114 (1983).
Hopfield, Feinstein and Palmer, "Unlearning Has Stabilizing Effects in Collective Memories," Nature, vol. 304, pp. 158, 159 (1983).

(List continued on next page.)

Primary Examiner—Michael R. Fleming
Assistant Examiner—Robert W. Downs
Attorney, Agent, or Firm—Fulbright & Jaworski

[57] ABSTRACT

A neural network content-addressable error-correcting memory system is disclosed including a plurality of hidden and visible processing units interconnected via a linear interconnection matrix. The network is symmetric and all self-connections are not present. All connections between processing units are present, except those connecting hidden units to other hidden units. Each visible unit is connected to each other visible unit and to each hidden unit. A mean field theory learning and retrieval algorithm is also provided. Bit patterns or code words are stored in the network via the learning algorithm. The retrieval algorithm retrieves error-corrected bit patterns in response to noisy or error-containing input bit patterns.

14 Claims, 9 Drawing Sheets

OTHER PUBLICATIONS

Diedrich and Opper, "Learning of Correlated Patterns in Spin-Glass Networks by Local Learning Rules," Physical Review Letters, vol. 58, pp. 949-952 (1987).

E. Gardner, "Maximum Storage Capacity in Neural Networks," Europhysics Letters, 4 (4), pp. 481-485 (1987).

Krauth and Mezard, "Learning Algorithms with Optimal Stability in Neural Networks," Journal of Physics A; Math. Gen., vol. 20, pp. 1745-1752 (1987).

Wallace, "Memory and Learning in a Class of Neural Networks Models," Lattice Gauge Theory—A Challenge to Large Scale Computing, Bunk and Mutter, Editors, New York: Plenum (1986).

Venkatesh, "Epsilon Capacity of Neural Networks," in J. S. Denker (Ed.), Neural Networks for Computing, Snowbird, Utah, 1986, American Institute of Physics Conference Proceedings, p. 151 (1986).

Hopfield and Tank, "'Neural' Computation of Decisions in Optimization Problems," Biol. Cybern. 52, 141-152 (1985).

Peter and Anderson, "A Mean Field Theory Learning Algorithm for Neural Networks," Complex Systems 1, pp. 995-1019 (1987).

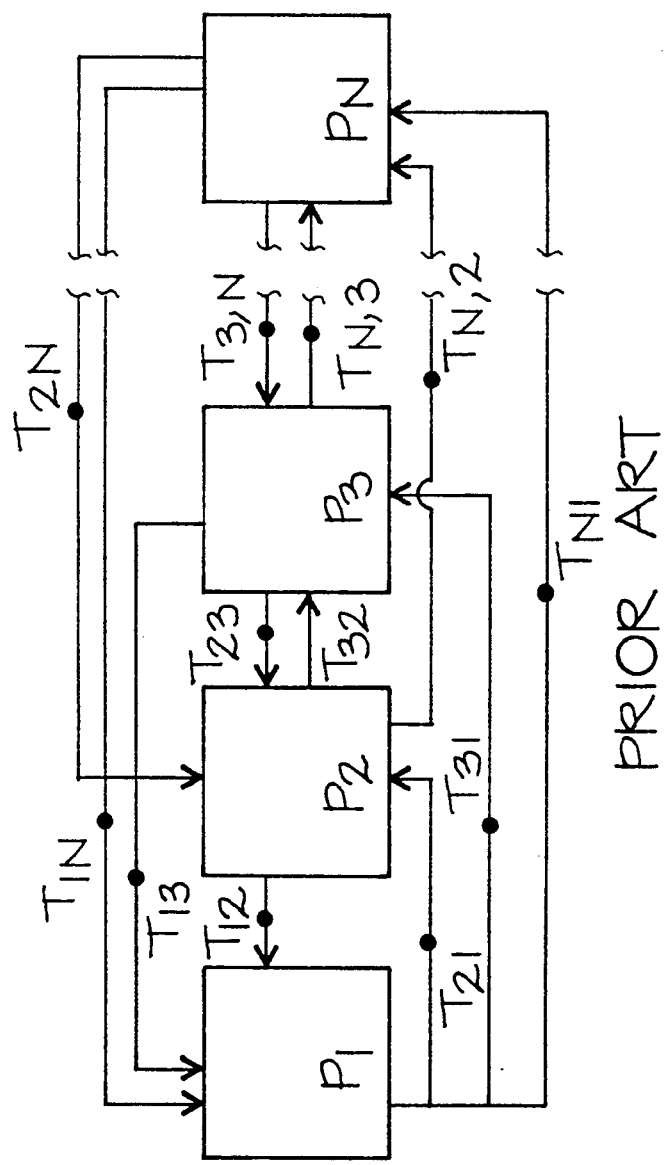

Fig. 2B

|  | P1 | P2 | P3 | P4 | P5 | P6 | P7 | • | PN | PB |
|---|---|---|---|---|---|---|---|---|---|---|
| P1 | ✕ | W12 | W13 | W14 | W15 | W16 | W17 | • | W1N | W1B |
| P2 | W21 | ✕ | W23 | W24 | W25 | W26 | W27 | • | W2N | W2B |
| P3 | W31 | W32 | ✕ | W34 | W35 | W36 | W37 | • | W3N | W3B |
| P4 | W41 | W42 | W43 | ✕ | W45 | W46 | W47 | • | W4N | W4B |
| P5 | W51 | W52 | W53 | W54 | ✕ | ✕ | ✕ | ✕ | ✕ | W5B |
| P6 | W61 | W62 | W63 | W64 | ✕ | ✕ | ✕ | ✕ | ✕ | W6B |
| P7 | W71 | W72 | W73 | W74 | ✕ | ✕ | ✕ | ✕ | ✕ | W7B |
| • | • | • | • | • | ✕ | ✕ | ✕ | ✕ | ✕ | • |
| PN | WN1 | WN2 | WN3 | WN4 | ✕ | ✕ | ✕ | ✕ | ✕ | WNB |
| PB | WB1 | WB2 | WB3 | WB4 | WB5 | WB6 | WB7 | WB• | WBN | ✕ |

INPUT (rows) / OUTPUT (columns)

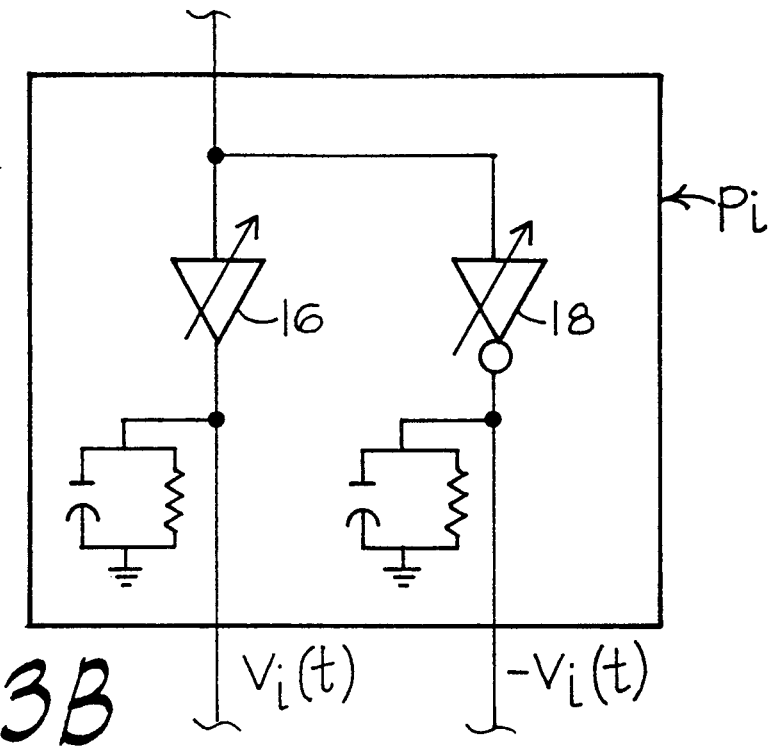
Fig. 3B
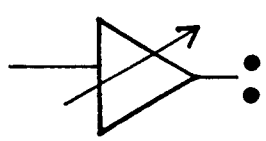 :  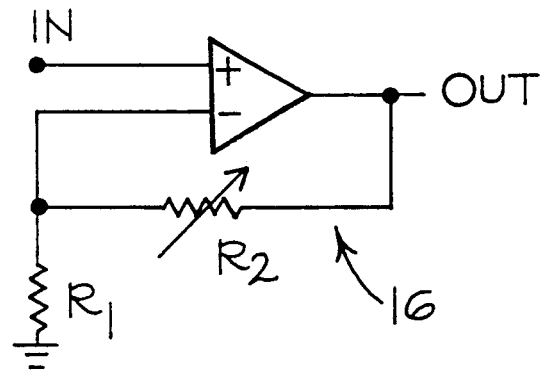
Fig. 4A
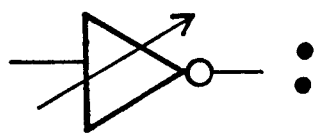 :  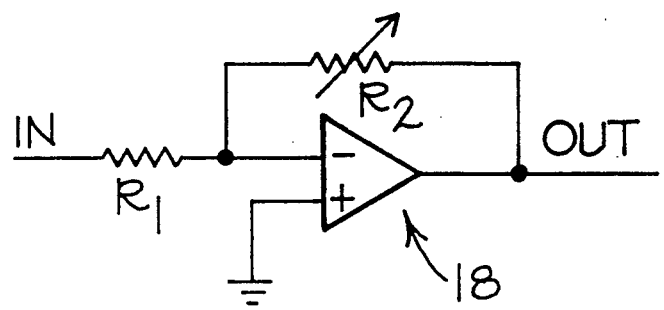
Fig. 4B

NEURAL-NETWORK CONTENT-ADDRESSABLE MEMORY

BACKGROUND OF THE INVENTION

1. Field of the Invention

This invention relates to content addressable memory systems useful in a variety of data and signal processing, image recognition and other computational tasks. In particular, the present invention relates to content-addressable memory architecture in combination with learning and retrieval methodologies for a neural network error-correcting content-addressable memory system.

2. Discussion of the Related Art

Content-addressable memory systems are generally distinguishable from random access memories on the basis of the manner in which stored data is retrieved. In random access memory systems, data is retrieved or located based upon a specified numerical, typically binary encoded address. In content addressable memory, or CAM, systems, data is recalled in response to the presentation of a noisy or partial version of one of a set of defined bit strings or codewords stored in memory.

In the case of "noisy" input problems, the task is to retrieve a noise-free version of the input bit pattern. This type of content-addressable memory is referred to as error-correcting content-addressable memory. The methodology and architecture of the present invention is particularly well-suited for such uses.

Error-correcting CAM optimally returns the pattern stored in memory which most closely resembles the input noisy bit string. The number of bits differing between the input string and the stored bit string is referred to as the Hamming distance. Thus, the task of error-correcting CAM is to return the stored bit string which is closest in Hamming distance to the input bit string.

In the case of partial-contents input tasks, the CAM function is less demanding, and essentially involves a comparison or table look-up function to locate and retrieve the complete bit string based upon the assumption that each of the bits in the partial input are correct. As will be appreciated by those of ordinary skill in the art, the architecture and methodology of the present invention are suitable for use in any error-correction or best match computational task.

The error-correcting CAM computational task can be reviewed as the decoding of codewords received from a noisy communication channel. In this application, a group of defined bit strings stored in memory constitute a set of valid data words, bit strings or codewords. The input "noisy" or error containing word is compared to the defined codewords, and the closest defined codeword is provided as an error-corrected output. In conventional error-correcting methodologies, the computational time and complexity increase in proportion to the number and bit length of defined codewords.

Neural networks are characterized by a high degree of parallelism between numerous interconnected simple processors. The neural network nomenclature is derived from the similarity of such networks to biological neural networks. See for example "Computing with Neural Circuits: A Model", Hopfield and Tank, Science, Vol. 233, pp. 622-633 (1986).

In general, neural networks are formed or modeled using a number of simple processors or neurons arranged in a highly interconnected pattern wherein each of the neurons performs the simple task of periodically updating its output state based upon the value of signals presented to it as inputs. The design of a neural network involves determining the number, arrangement and weight of the interconnections between neurons. The weight of a connection corresponds to the biological synaptic strength and determines the degree in which the output signal on one neuron will effect another neuron to which it is connected. Thus, each neuron or processor receives input signals which are derived from the output or activation states of other connected neurons. These activation states or output signals are linearly operated on via the connective weights and then summed. The summation of inputs can be accomplished in an analog circuit using a capacitor shunting the input, for example, so that the net input voltage is the integrated sum of all input voltages. This input signal or state is then operated on by a non-linear processor function to produce an updated output activation state. Alternatively, the input signals can be summed by operation of the resistive or conductive network in parallel to the input of an operational amplifier having a shunting capacitor/resistor output stage. To provide an analog to inhibitory synaptive effects, a pair of operational amplifier circuits can be used to model the neuron or processor with one receiving input signals on the normal input and the other receiving input signals on the inverted input.

The connections between processors or neurons can be uni-directional (feed forward) or bi-directional. The processor function can be a step function which produces a binary output based upon whether or not the input signal achieves a defined threshhold value, or it may be a sigmoid function such as the hyperbolic tangent which produces an analog activation state output. The pattern of connectivity among processors is referred to as the network architecture.

In a neural network, each processor or unit need only have sufficient memory to represent its current activation state or value. The unit's activation state is placed on its outgoing connections and is readable by those other units to which it is connected. Input signals are provided to the neural network by constraining or fixing the activation states of selected units, designated as input units. The remainder of the units then repeatedly update their respective activation states until the network settles into a steady state. The steady state value of the activation states of designated output units constitutes the network output signal.

In error-correcting CAM networks, the activation state of a unit or single processor represents a single bit in a bit pattern. If the unit's processor function is a step function, each unit is either "on" or "off". If the processor function is sigmoid or analog, each unit's activation state is interpreted as being "on" or "off" based upon whether it is above or below the midpoint of its range of values. Thus, while in both cases the output is binarily coded, in analog networks the activation states of particular units contribute to or affect the input state of connected units whether or not the output is interpreted as "on" or "off". In binary step function networks, the output activation state of each unit is either "on" or "off" based upon an input threshhold.

Information or data is stored in a neural network by setting the connection weights to prescribed values. It is the correct pattern of connection weights between individual units that enables the output units to adopt the correct stable pattern of activation in response to a given input activation state placed on the input units. In analog circuitry, the connection weights are typically represented by the linear resistance or conductance value of resistors between outputs and inputs of various interconnected processor units. The processor function in analog networks can be modeled by a pair of operational amplifiers having the appropriate sigmoid transfer function.

Given a specific task, i.e., error-correcting CAM, cost minimization, image recognition, etc., a learning algorithm is developed to determine the correct values for the weights, thereby effectively programming and storing data in the network. In error-correcting CAM, the first step is to store a set of bit patterns in the network which correspond to legal or correct bit strings or code-words. Thereafter, if a noisy or error-containing bit pattern is presented as an input to the network, the activation states of the output stabilize in the pattern of activation that, among patterns stored in the network, differs in the least number of bits or Hamming distance, from the input bit pattern.

The primary advantage of neural network CAM is that contrary to conventional error-correcting methodology implemented with programmed computers where the time required to execute increases substantially with the size and number of stored patterns, retrieval in a neural network implemented in hardware is a fully parallel process and takes only the time necessary for the circuit to settle in the steady state.

A neural network content-addressable memory model suitable for error-correction was disclosed in Hopfield, "Neural Networks and Physical Systems with Emergent Collective Computational Abilities", Proceedings of the National Academy of Science, U.S.A., Vol. 79, pp. 2554-2558 (1982). This method of modeling neural networks utilized a step-function processor function and bi-directional connections. Significantly, the Hopfield model disclosed the importance of symmetric weighting of the connection matrix, i.e., where $W_{ij} = W_{ji}$ for all W (conductance) values of the interconnecting branches between unit i and unit j. Hopfield disclosed that a network having an interconnectional weight matrix wherein all $W_{ij} = W_{ji}$, and all diagonal elements $W_{ii} = 0$ will always converge to a given stable state given any chosen initial input state. Hopfield disclosed that such networks were useful as content-addressable memories wherein each keyword was associated with a particular stable state, so that when an input bit string was presented as an initial activation value (representing an error-containing bit string) to the network, the network would evolve over time to a stable activation state which would represent an error-corrected version of the input bit string.

A subsequent Hopfield model also demonstrated that an analog circuit comprised of operational amplifiers having an inverted and a normal output, and having resistor-capacitor input summing elements and a resistive connection matrix was able to operate as a CAM. Hopfield further demonstrated that while mathematic models required symmetry, real world circuits functioned adequately provided the interconnection impedance was approximately symmetrical Hopfield further disclosed that neither the gain or transfer function of the operational amplifiers nor the input capacitance need be strictly equivalent to their symmetric counterparts to produce satisfactory results in the analog circuit model, provided the gain curve was steep, i.e., in high gain systems.

FIG. 1 is a schematic illustration of a Hopfield model network. In the Hopfield model, the neurons or units were not segregated into distinct sets or layers of input and output units. Rather, the input and output units were the same, and the input activation states were simply corrected in place. In other words, an initial input state was placed on the units and then allowed to evolve to a stable state representing the corrected bit string.

In the Hopfield model, all units were interconnected and the interconnectivity weights were determined according to the Hebbian rule, a single-pass, non-iterative calculation. Compared to iterative algorithms, which make repetitive modifications of the weights until a prescribed criterion is satisfied, the Hebbian method is primitive, and can store no more than 0.14N uncorrelated or random patterns, where N is the number of units or processors in the network.

A variety of algorithms to improve the storage capacity of the Hopfield model have been disclosed. These are the unlearning method of Crick and Mitchison, "The Function of Dream Sleep", Nature, Vol. 34, pp. 111-114 (1983); Hopfield, Feinstein and Palmer "Unlearning Has Stabilizing Effects in Collective Memories", Nature, Vol. 304, pp. 158, 159 (1983); the bi-directional perceptron algorithm of Diedrich and Opper, "Learning of Correlated Patterns in Spin-Glass Networks by Local Learning Rules", Physical Review Letters, Vol. 58, pp. 949-952 (1987); E. Gardner, "Maximum Storage Capacity in Neural Networks", Europhysics Letters, Vol. 4, 4, pp. 481-85 (1987); Krauth and Mezard, "Learning Algorithms with Optimal Stability in Neural Networks", Journal of Physics A; Math. Gen., Vol. 20, pp. 1745-1752 (1987); and Wallace, "Memory and Learning in a Class of Neural Network Models", Lattice Gauge Theory—A Challenge to Large Scale Computing, Bunk and Mutter, Editors, New York: Plenum (1986). These methods and others have increased storage capacities in Hopfield models to a larger fraction of N. For Hopfield models, a theoretical capacity limit of 2N random patterns has been derived. Venkatesh, "Epsilon Capacity of Neural Networks", in J. S. Denker (Ed.), Neural Networks for Computing, Snowbird, U.T. 1986, American Institute of Physics Conference Proceedings, p. 151 (1986).

For practical utility in noise correction applications, this storage capacity is too low. If transmitted bit patterns are all of length N, it is typically required that there be many more than 2N legal or codeword patterns in memory. Often, the number of patterns or codewords required is an exponential function of the length of the bit pattern.

One significant limitation of the Hopfield model networks is the inability to utilize hidden units or processors. A hidden unit is one which is not designated for input/output functions (termed visible units) but which may be utilized to learn alternate encodings of bit patterns being stored, and can thus facilitate storage and retrieval across the output units. Algorithms for bi-directional, feedforward and other types of networks utilizing hidden units have been developed by others. See for example, Peterson and Hartman, "Explorations of the Mean Field Theory Learning Algorithm", MCC ACA-ST/HI-065-88, Microelectronics and Computer Technology Corporation (1988), the contents of which are incorporated by reference herein to illustrate the background of the invention and the state of the art. None of the prior developed neural network models and learning algorithms have been demonstrated to yield storage capacities greater than 4N.

SUMMARY OF THE INVENTION

A neural network content-addressable memory system is comprised of three essential elements:

1. The network structure, which includes the type of neurons or units, the type, degree and weight of interconnections and the architecture;

2. A learning algorithm or methodology for programming the memory by selecting the interconnection weight matrix; and 3. A retrieval algorithm or methodology utilized to retrieve error-corrected bit patterns in response to noisy or error-containing input bit patterns.

The present invention relates to a novel method of manufacturing error-correcting CAM including a novel architecture based upon a mean field theory approximation of a Boltzmann machine, a learning algorithm and a retrieval algorithm that together enable the CAM network to store a number of bit patterns or codewords that increases rapidly with the number of hidden units. The rate of enhancement of storage capability is significantly greater the rate of increase in hidden units.

The error-correcting neural network CAM of the present invention utilizes a mean field theory network, including analog sigmoidal transfer function processors or units and includes hidden units. Contrary to the teaching of the prior art, which suggests that increased storage capacity can best be achieved utilizing a fully connected architecture, the present invention provides an architecture wherein the hidden units are essentially decoupled from each other. Through extensive modeling and experimentation procedures, it has been discovered that as one increases the number of hidden units in a fully connected network, the number of storable bit patterns actually decreases. It should be noted that while the method of the present invention utilizes a mean field theory learning algorithm, due to the relationship of mean field theory algorithms to Boltzmann machine learning, it is to be expected that the architecture, learning algorithm, and retrieval algorithm of the present invention could be successfully utilized in a Boltzmann machine system.

BRIEF DESCRIPTION OF THE DRAWINGS

The following detailed description of the preferred embodiment can best be understood when read in conjunction with the following drawings, wherein:

FIG. 1 is a schematic illustration of the architecture of a prior art neural network suitable for use as content-addressable memory;

FIG. 2B is a chart illustrating the preferred form of connection matrix for a system according to the present invention;

FIGS. 3A and 3B are a schematic illustration of one form of analog circuit suitable for use in manufacturing a neural network content-addressable memory in accordance with the present invention; and FIGS. 4A and 4B are a schematic illustration of a portion of one form of analog circuit suitable for use in manufacturing a neural network content-addressable memory in accordance with the present invention.

DETAILED DESCRIPTION OF THE PREFERRED EMBODIMENT

The method of the present invention provides a novel architecture in combination with a learning algorithm and a retrieval alqorithm which produces a neural network error-correcting content-addressable memory capacity having substantially higher order memory capacity than prior methods or networks. It should be noted that lessor degrees of the substantial improvement achieved by the present invention can be obtained utilizing methodologies which deviate slightly from the preferred embodiment. One of the characteristics of neural networks is that nearly all of their salient characteristics may be varied or damaged without catastrophic consequences to their performance. As the variation or damage increases, the performance of the system will gradually degrade.

The Preferred Architecture

Referring now to FIG. 2, the letter N designates generally a neural network content-addressable memory in accordance with the present invention. Network N includes a plurality of processing units $P_1$, $P_2$, $P_3$ ... $P_N$. Each processing unit is designed to be suitable as a unit cell for integration in an analog VLSI integrated circuit. Each processor has an input terminal 10 and an output terminal 12. The activation state of each processor is an active signal present at the output terminal 12 and is the result of the processor's sigmoidal transfer function operating on the input signal present on terminal 10. To achieve inhibitory or negative weighting effects, each processor comprises a pair of operational amplifiers, one with a normal input and one with an inverted input.

Figure 2A:
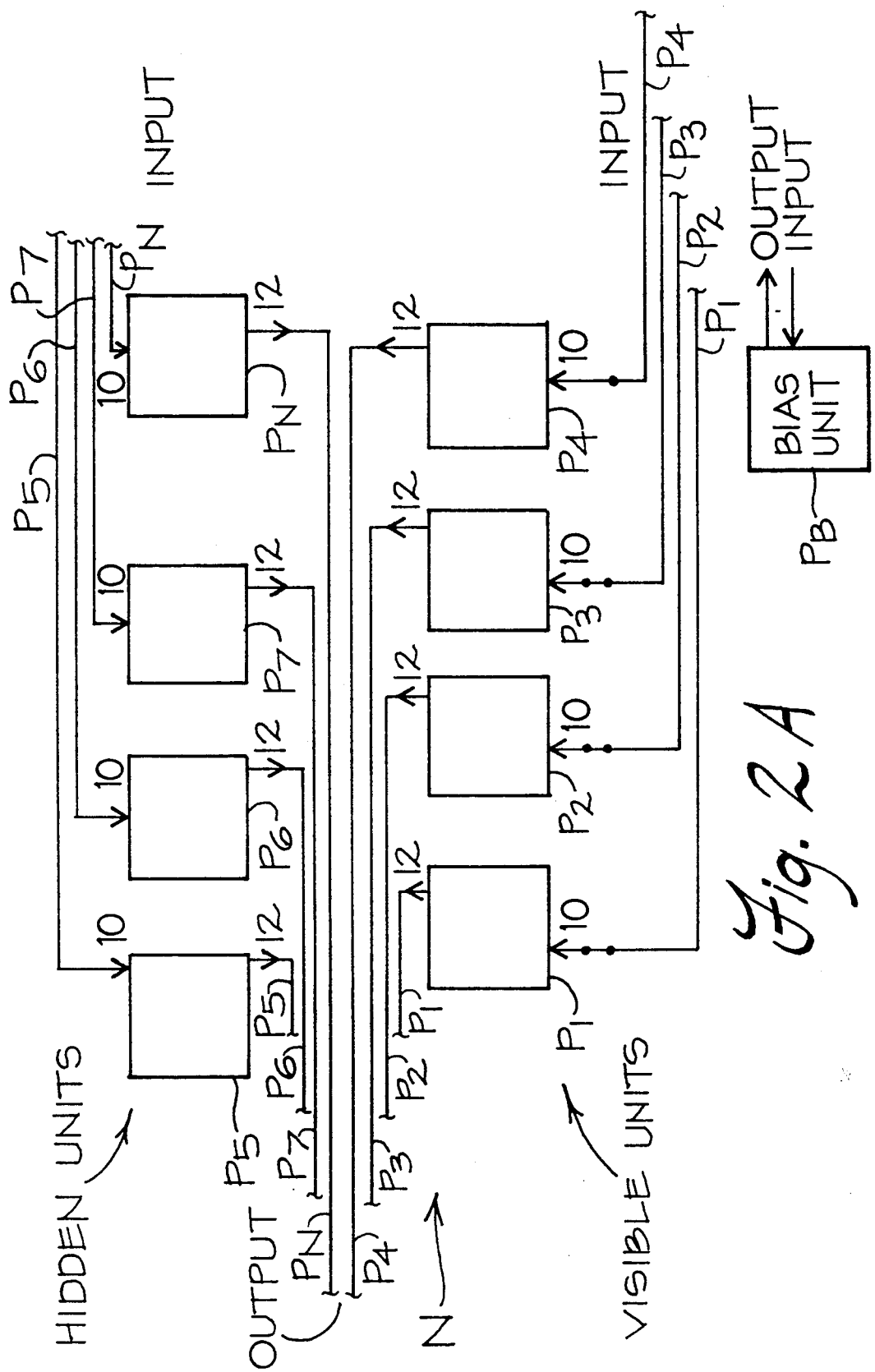
FIG. 2A is a schematic illustration of the architecture of a neural network content-addressable memory made in accordance with the method of the present invention.

The processing units P are divided into a first visible group, designated $P_1$-$P_4$ in FIG. 2A, and a second, hidden group, designated $P_5$-$P_N$. The visible group is utilized for input/output functions and are "visible" to the user. The hidden units are utilized to store bit-patterns but are not part of the user interface. It should be noted that, in practical applications, the number of processing units, both hidden and visible, may be very large and it is only for the purposes of clarity that a small number of units are schematically included in the drawings.

Ideally, the physical connections between processors P are bidirectional, although for analog circuit implementation a pair of parallel uni-directional connectors can be used. Every connection between a processor $P_i$ and a processor $P_j$ includes a linear transfer function element, such as a resistance or conductance. The impedance value of these interconnection elements, designated $W_{ij}$, $W_{ji}$, etc., wherein the resistance $R = 1/W$ or $R_{ij} = 1/W_{ij}$, $R_{ij} = 1/W_{ij}$, etc., is what determines the stable states of the network, and the stored data or bit patterns. Thus, the impedance between the output of processor $P_j$ and the input to processor $P_i$ will be designated $W_{ij}$.

In the preferred embodiment, as seen in FIG. 2B, all self-connections, i.e., $W_{ii}$ are not present, therefore $W_{ii}$ (conductance) = 0 for all i. Also the network N is symmetric, so $W_{ij} = W_{ji}$ for all i, j. All connections between processors are present, except those connecting hidden units to other hidden units. Each visible unit is connected to each other visible unit and to each hidden unit. Also present are the connections from a bias processor $P_B$ to all other processors. Processor $P_B$ is always in an "on" condition to provide a bias or initialization level input to set the operating point for the network. The use of a biasing processor for this purpose is well known in the art.

For clarity, the schematic of FIG. 2A does not show physical interconnection elements $W_{ij}$ or the connecting conductors. The chart of FIG. 2B illustrates the connection matrix of the preferred embodiment. In FIG. 2B, an "x" denotes no connection, whereas a $W_{ij}$ such as $W_{12}$, $W_{21}$ etc. denotes a connection between processors $P_1$ and $P_2$ exists, with $W_{12}$ being the impedance value or weight assigned to the connection between the input to processor $P_1$ and the output of processor $P_2$. The decoupling or lack of connections between hidden processors is a key element of the present invention.

While it is preferred that all hidden to hidden connections be absent, some degree of the advantages of the present invention are still obtained if a slight degree of hidden to hidden connectivity exists. Some advantage is also obtained if some of the visible to visible connections are absent, although when the number of hidden units is relatively low performance is significantly degraded if many of the visible to visible connections are absent. Similarly, some visible to hidden connections may be omitted without substantial loss in performance. The essential feature is to keep the number of hidden to hidden unit connections relatively low or zero.

One method of implementing a neural network CAM of the present invention in an analog circuit suitable for very large scale integration is illustrated in FIG. 3. In FIG. 3 each processor P includes a pair of variable gain operational amplifiers 16 and 18. Amplifiers 16 and 18 provide the normal and inverted non-linear transfer function for each processor. In the preferred embodiment, the gain or transfer function of amplifiers 16 and 18 is siqmoidal. To facilitate the learning and retrieval methodologies of the present invention, it is necessary that the gain function of amplifiers 16 and 18 be variable. This may be achieved in any suitable, known method, such as that illustrated in FIG. 4.

The Learning Algorithm

In the error-correcting CAM of the present invention, each visible unit functions as both an input and an output unit. The network input state representing the error-containing signal is placed on the output terminals of the visible units as an initial network activation state. The network output or error-corrected signal evolves from this initial input activation state represented by the output signal values of the visible units.

In a mean field theory network, the connection weight matrix $W_{ij}$ is symmetric. Some asymmetry of the connection can be tolerated; too much asymmetry will degrade performance. The processor output or activation states $V_i$ are periodically updated according to:

$$V_i = \sigma(\Sigma\, W_{ij}\, V_j/T)$$

Where the parameter T, called the "temperature" sets the slope or gain of the sigmoidal transfer function $\sigma(X) = \tanh(x)$. The sum is the total input to unit i from all the other units or processors connected to unit i. $V_j$ is the activation state or output of all the units or processors to which unit i has connections. The range of the tanh function runs between $-1$ and $1$. It is not essential that the network operate within this range. The activation states can be operated in other ranges such as 0,1 by shifting and scaling the tanh function.

The patterns or code words to be stored in the network via the learning algorithm are called the set of training patterns. The MFT network of the present invention is trained or programmed by repeatedly presenting each training pattern to the network input/output units in two phases:

1. The Clamped Phase. In this phase, the visible units are clamped or constrained to the activation values representing a particular training pattern of bit values. Beginning with a relatively high value of T, the remaining unit or processor activation states are repeatedly updated in accordance with the above equation for $V_i$, while the value of T (the inverse gain of the analog amplifiers) is gradually lowered. This process is referred to as annealing.
2. The Free Phase. In this phase, only a portion of the visible units are clamped and the network is again annealed. The unclamped visible units and the hidden units are repeatedly updated in accordance with the above equation for $V_i$. Clamping approximately half of the visible units in this state is preferred, although other proportions will provide satisfactory results. What is important is to not clamp all the visible units, and to provide as much variation in the specific visible units which are clamped in the free phase as the number of units and free phase repetitions will permit.

The units can be updated synchronously or asynchronously. The number of times each unit is updated at each temperature T, as well as the amount the temperature is reduced each time are the parameters of the method. The exact values of these parameters are not important; they must be compatible with one another, and if they are not within a reasonable range the system will not be able to store or retrieve the training bit patterns. The preferred parameter values are: Initial $T=40$; lower T by multiplying the current T value by 0.7; update each unclamped unit once per T value; and continue iteration until T is approximately equal to 1.0. Moderate deviation from this regimen will produce satisfactory results. Reasonably good performance can be obtained even if T is held constant.

Denoting the final activation state of the units in the clamped phase as $V_i$ and in the free phase as $V_i'$, the contribution to the change to the weights due to a training patterns is then given by:

$$\Delta W_{ij} = \eta(V_i V_j - V_i' V_j')$$

When $\eta$ is a parameter called the learning rate. The value of this parameter is not critical to achieving satisfactory results unless it is severely out of range in the context of the other parameter settings. The preferred range is 0.005 to 0.05. These weight changes can be applied after each pattern presentation or can be accumulated and applied less frequently. This procedure implements gradient descent in an information-theoretic measure.

This preferred learning methodology can tolerate variation without ceasing to be effective. For instance, more than one free and/or clamped phase could be run for each pattern, and the number of clamped and free phases do not have to be equal; in such a case one would presumably find better results if the $\eta$ value associated with each phase were inversely proportional to the number of phases run. Another variation which can be tolerated is that it is not necessary that every visible unit be clamped in the clamped phase. It is also not critical that every unclamped unit be updated at every temperature as long as a sufficient proportion is updated on average to achieve the learning function.

An alternate embodiment of this preferred learning methodology is to arbitrarily choose an activation pattern for the hidden units to correspond to a particular training pattern or codeword. Thereafter, for training purposes but not retrieval, treat all the units as visible. That is, in the clamped phase, all the units in the network are clamped (the hidden units are clamped to the arbitrarily selected pattern chosen to be associated with the training pattern to which the visible units are clamped), and in the free phase, the units to be clamped are chosen from among all the units in the network. For retrieval, the hidden units are again treated as hidden units.

The Retrieval Algorithm

In error-correction CAM systems the goal is to correct any errors in the state of the input activation states on the visible units. In the present invention, the preferred retrieval methodology is as follows:

1. The visible units are clamped to the initial input activation state;
2. The hidden units are each updated once in accordance with the above equation setting $T=2$;
3. The visible units are released; any visible units having known correct state kept clamped;
4. The annealing proceeds downward, with the value of the gain function T being repeatedly multiplied by 0.9 for approximately six or more repetitions, where at each value T the unclamped units are updated.

Again these parameter values are not the only acceptable values. Some satisfactory results can be obtained by constant low temperature retrieval. If less than all of the hidden units are updated before the visibles are updated, then performance will degrade as the number not updated increases.

In carrying out these learning and retrieval methods, a unit is clamped by providing a fixed external signal level to the output of the particular clamped units. One variation of the preferred method is to gradually unclamp the visible units by gradually decreasing the value of the external input. An external signal $I_i$ is added to the input of the visible units as follows:

$$V_i = \eta(\Sigma\ W_{ij}\ V_j/T + I_i)$$

Wherein $I_i$ is initially large enough to ensure that $V_i$ is reasonably near the clamped value which is $\pm 1$. Then as the temperature T is lowered, $I_i$ is gradually reduced and gradually unclamps the activation state. In this variant, $I_i$ should be held at the initial clamped value for all visible units known to be correct.

Another alternative is to first clamp the visible units and anneal the hidden units, then clamp the hidden units and anneal the visible units keeping all visible units known to be correct clamped.

The foregoing disclosure provides a novel method of producing a neural-network error-correcting content-addressable memory. The novel network architecture and storage and retrieval methodologies provide a network with superior storage capacities for a given number of processor units. The network is well suited for analog very large scale integrated circuitry.

In practice, the learning aspect of the method may be performed on a computer based model wherein the connective weights $W_{ij}$ are easily varied. In a suitable computer based model, the iterative annealing and updating to program the stored bit patterns can be achieved and the connective weights thereby determined can be incorporated into a hardware system. Once a hardware network has been programmed, the annealing required in the retrieval methodology can be carried out by adjustment of the gain or transfer function of the analog circuit processor units.

I claim:

1. A neural network content-addressable error-correcting memory system of the type used to provide an error-corrected output signal in response to an error-containing input signal, said system comprising:
    (a) a plurality of visible input/output processing units each having an input terminal and an output terminal, said visible processing units adapted to provide an output signal $V_i$ in response to input signal conditions:
    (b) a plurality of hidden processing units each having an input terminal and an output terminal, said hidden processing units adapted to provide an output signal $V_i$ in response to input signal conditions;
    (c) a plurality of linear circuit connection elements, each having an impedance value, said connection units connecting the outputs and inputs of selected visible and hidden processing units, wherein the impedance value of said connection elements is selected as a means for storing a prescribed set of error-free codewords; and
    (d) said plurality of connection elements and said visible and hidden processing units forming a network wherein;
        (i) substantially no connections are present between the output of a processing unit and its input;
        (ii) the impedance value of all connecting elements between a first processing unit and a second processing unit are substantially equal;
        (iii) the output and input of each visible processing unit is connected to the input and output respectively of each other visible processing unit and to the input and output respectively of each hidden processing unit; and
        (iv) there are substantially no connections between hidden processing units.

2. The network of claim 1, wherein said visible and hidden processing units have a binary transfer function.

3. The network of claim 1, wherein said visible and hidden processing units have an analog transfer function.

4. The network of claim 3, wherein said analog transfer function is sigmoidal.

5. The network of claim 3, wherein said visible and hidden processing units comprise a variable gain operational amplifier.

6. The network of claim 3, wherein said visible and hidden processing units comprise a first variable gain operational amplifier, and a second variable gain operational amplifier, said first variable gain operational amplifier and said second variable gain operational amplifier each being connected to a common input terminal; said first variable gain operational amplifier being adapted to provide a first output signal in response to input signal condition; said second variable gain operational amplifier being adapted to provide a second inverted output signal in response to input signal conditions.

7. A method of operating a neural-network content-addressable error-correcting memory system of the type used to provide an error-corrected output signal in response to an error-containing input signal, wherein said network comprises:
  (a) a set of visible processors adapted to provide an output signal $V_i$ in response to input signal conditions, each processor having an input terminal and an output terminal;
  (b) a set of hidden processors adapted to provide an output signal $V_i$ in response to input signal conditions, each processor having an input terminal and an output terminal; and
  (c) a network interconnection matrix comprised of linear connection elements connecting the output and input terminals of selected processors to the input and output terminal of other selected processors, each linear connection element having an impedance value selected to facilitate storing of a prescribed set of error-free codewords, said interconnection matrix being constructed in accordance with the following network architecture, wherein the symbol $W_{ij}$ represents the conductance of the linear connection elements connecting the output of processor j to the input of processor i;
    (i) substantially all $W_{ii}=0$;
    (ii) substantially all $W_{ij}=W_{ji}$;
    (iii) substantially all visible processors are interconnected;
    (iv) substantially all visible processors are interconnected to each hidden processor;
    (v) substantially all hidden processor to hidden processor connections are absent;
said method of operating comprising the steps of:
  (1) providing a learning algorithm to select the impedance value of the particular linear connection elements and to thereby store the bit patterns representative of the codewords, wherein the learning algorithm comprises the steps of:
    (a) selecting an initial value for each connection element $W_{ij}$;
    (b) clamping the output signal values $V_i$ of the visible processors to a particular bit pattern representing one of the codewords to be stored;
    (c) providing an updated output signal value $V_i$ for each of the unclamped processors according to the following equation:

$$V_i = \sigma(\Sigma W_{ij} V_j / T)$$

wherein the symbol $\sigma$ represents the transfer function of the processor, the parameter T is an arbitrarily selected scalar, and $V_j$ is the output of all processors to which processor i has connections;
    (d) gradually reducing the value of parameter T and calculating an updated value for each unclamped $V_i$ for each value of T;
    (e) unclamping a portion of the visible processors and repeating steps (c) and (d) for each unclamped processor to arrive at a final output signal value $V_i'$ for each unclamped processor; and
    (f) revising the values $W_{ij}$ in accordance with the following equation:

$$\Delta W_{ij} = \eta(V_i V_j - V_i' V_j')$$

wherein the value of parameter $\eta$ is a constant, prescribed learning rate value; and
  (2) providing a retrieval algorithm to facilitate retrieval of a prescribed stored codeword in response to an error-containing input condition.

8. The method of claim 7, wherein the value of parameter $\eta$ is selected to be within the range of from about 0.0005 to about 0.05.

9. The method of claim 7, wherein the retrieval algorithm comprises the steps of:
  (a) clamping the output signal values of the visible processors to the value of an error-containing input bit pattern;
  (b) providing an updated output signal value $V_i$ for each of the unclamped processors according to the following equation:

$$V_i = \sigma(\Sigma W_{ij} V_j / T)$$

wherein $\sigma$ represents the transfer function of the processors and the parameter T is an arbitrarily selected scalar;
  (c) unclamping the output signal values of the visible processors;
  (d) repeating step (b) for all unclamped processors while gradually reducing the value of scalar T; and
  (e) providing the final value of outputs $V_i$ of the visible units as an error-corrected version of the input bit pattern.

10. The method of claim 9, wherein the initial value of scalar T is initially set equal to about 40, and subsequent reduced values of T are determined by multiplying the current T value by 0.7.

11. The method of claim 10, wherein the scalar value of T is reduced until the value equals approximately 1.0.

12. A method of operating a neural-network content-addressable error-correcting memory system of the type used to provide an error-corrected output signal in response to an error-containing input signal, wherein said network comprises:
  (a) a set of visible processors adapted to provide an output signal $V_i$ in response to input signal conditions, each processor having an input terminal and an output terminal;
  (b) a set of hidden processors adapted to provide an output signal $V_i$ in response to input signal conditions, each processor having an input terminal and an output terminal; and
  (c) a network interconnection matrix comprised of linear connection elements connecting the output and input terminals of selected processors to the input and output terminal of other selected processors, each linear connection element having an impedance value selected to facilitate storing of a prescribed set of error-free codewords, said interconnection matrix being constructed in accordance with the following network architecture, wherein the symbol $W_{ij}$ represent the conductance of the linear connection elements connecting the output of processor j to the input of processor i;
    (i) substantially all $W_{ii}=0$;
    (ii) substantially all $W_{ij}=W_{ji}$;
    (iii) substantially all visible processors are interconnected;
    (iv) substantially all visible processors are interconnected to each hidden processor;
    (v) substantially all hidden processor to hidden processor connections are absent;

said method of operating comprising the steps of:
(1) providing a learning algorithm to select the impedance value of the particular linear connection elements and to thereby store the bit pattern representative of the codewords; and
(2) providing a retrieval algorithm to facilitate retrieval of a prescribed stored codeword in response to an error-containing input condition, wherein the retrieval algorithm comprises the steps of:
 (a) clamping the output signal values of the visible processors to the value of an error-containing input bit pattern;
 (b) providing an updated output signal value $V_i$ for each of the unclamped processors according to the following equation:

$$V_i = \sigma(j\Sigma W_{ij}V_j/T)$$

wherein $\sigma$ represents the transfer function of the processors and the parameter T is an arbitrarily selected scalar;
 (c) unclamping the output signal values of the visible processors;
 (d) repeating step (b) for all unclamped processors while gradually reducing the value of scalar T; and
 (e) providing the final value of outputs $V_i$ of the visible units as an error-corrected version of the input bit pattern.

13. The method of claim 12, wherein the initial value of scalar T is initially set equal to about 40, and subsequent reduced values of T are determined by multiplying the current T value by 0.7.

14. The method of claim 13, wherein the scalar value of T is reduced until the value equals approximately 1.0.

* * * * *

UNITED STATES PATENT AND TRADEMARK OFFICE
CERTIFICATE OF CORRECTION

PATENT NO. : 5,253,328
DATED : October 12, 1993
INVENTOR(S) : Hartman

Figure 3A:
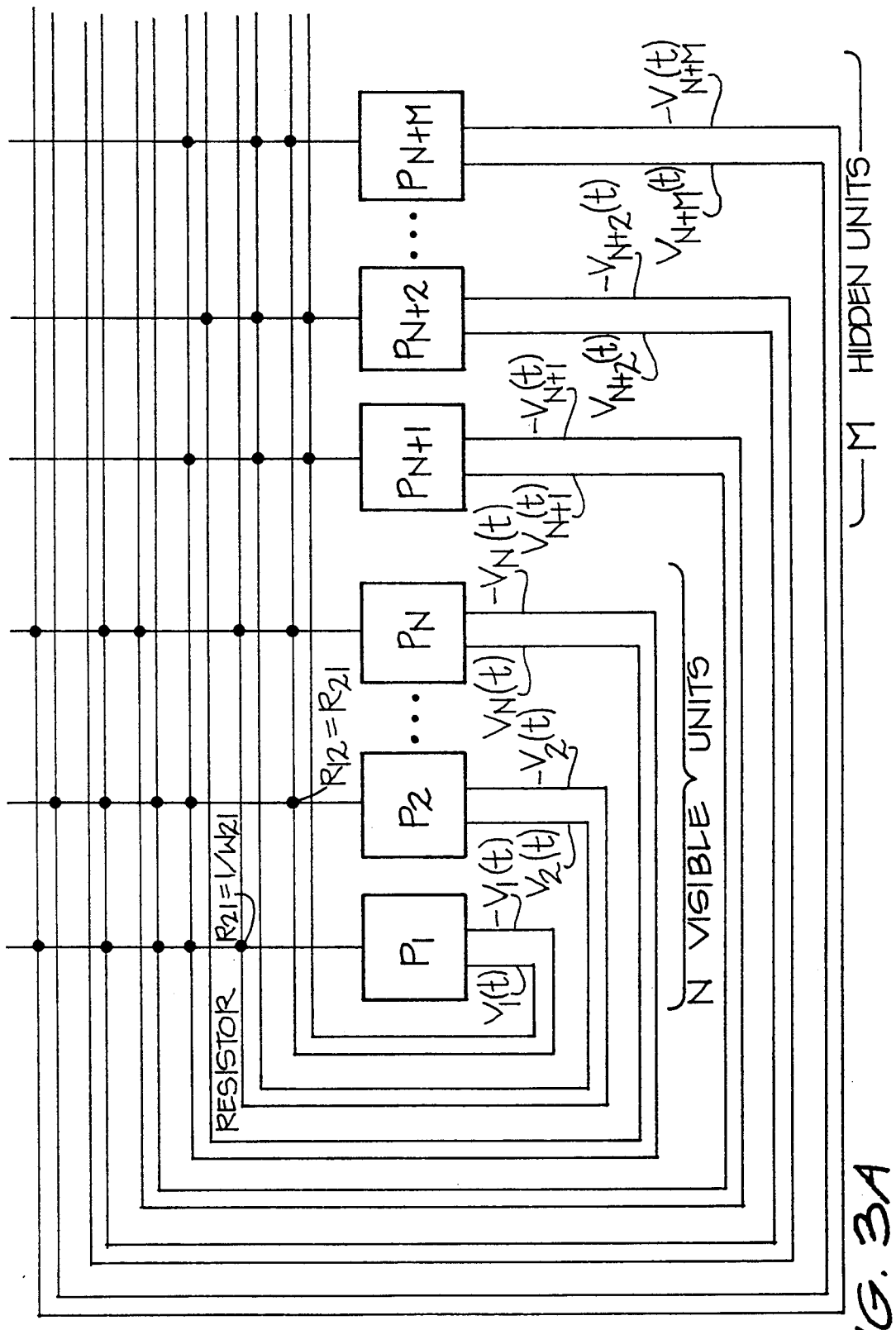
Figure 5A:
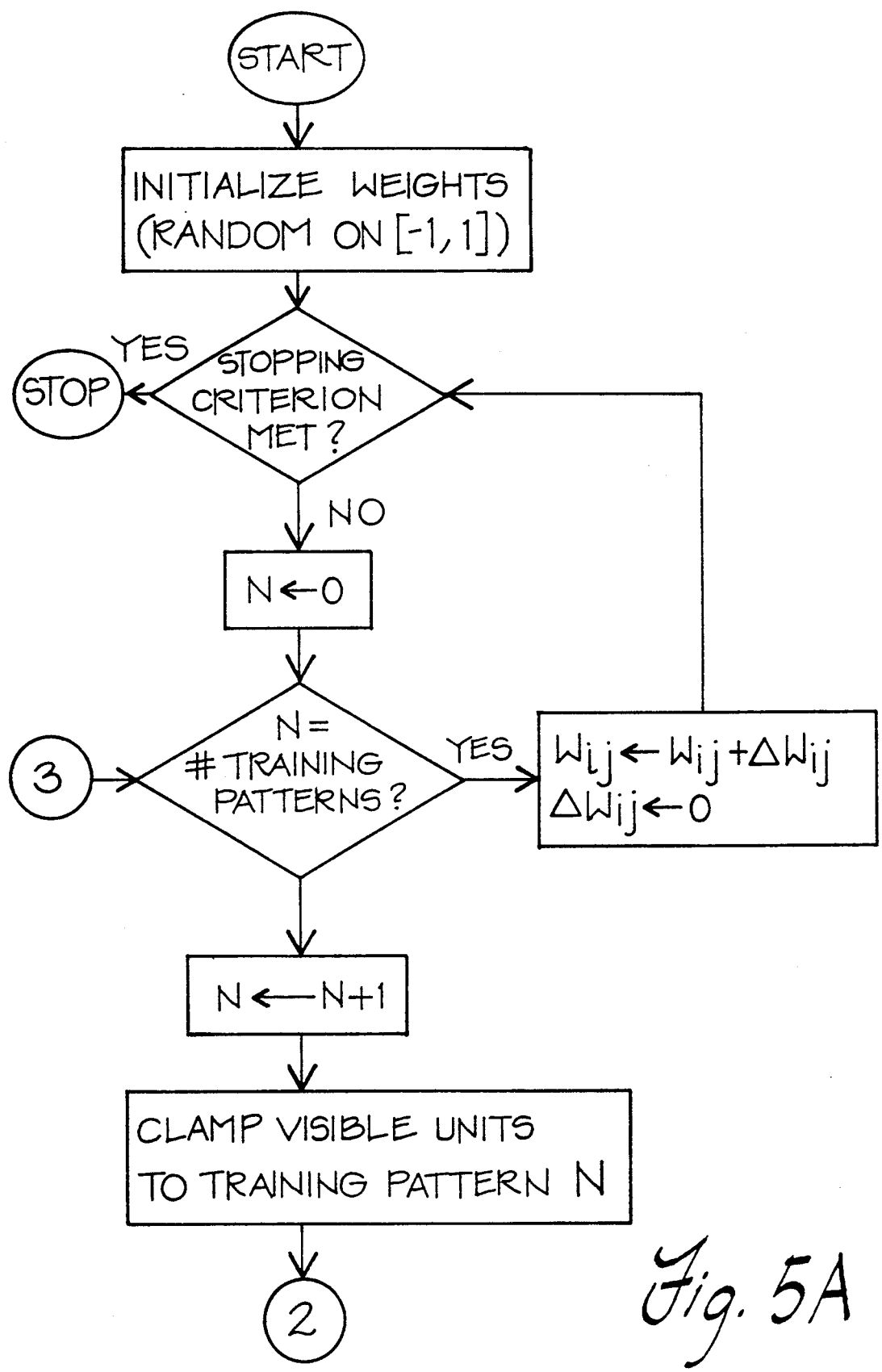
FIGS. 5A, 5B, 5C and 5D are a flow chart for the learning algorithm of the present invention.
Figure 5B:
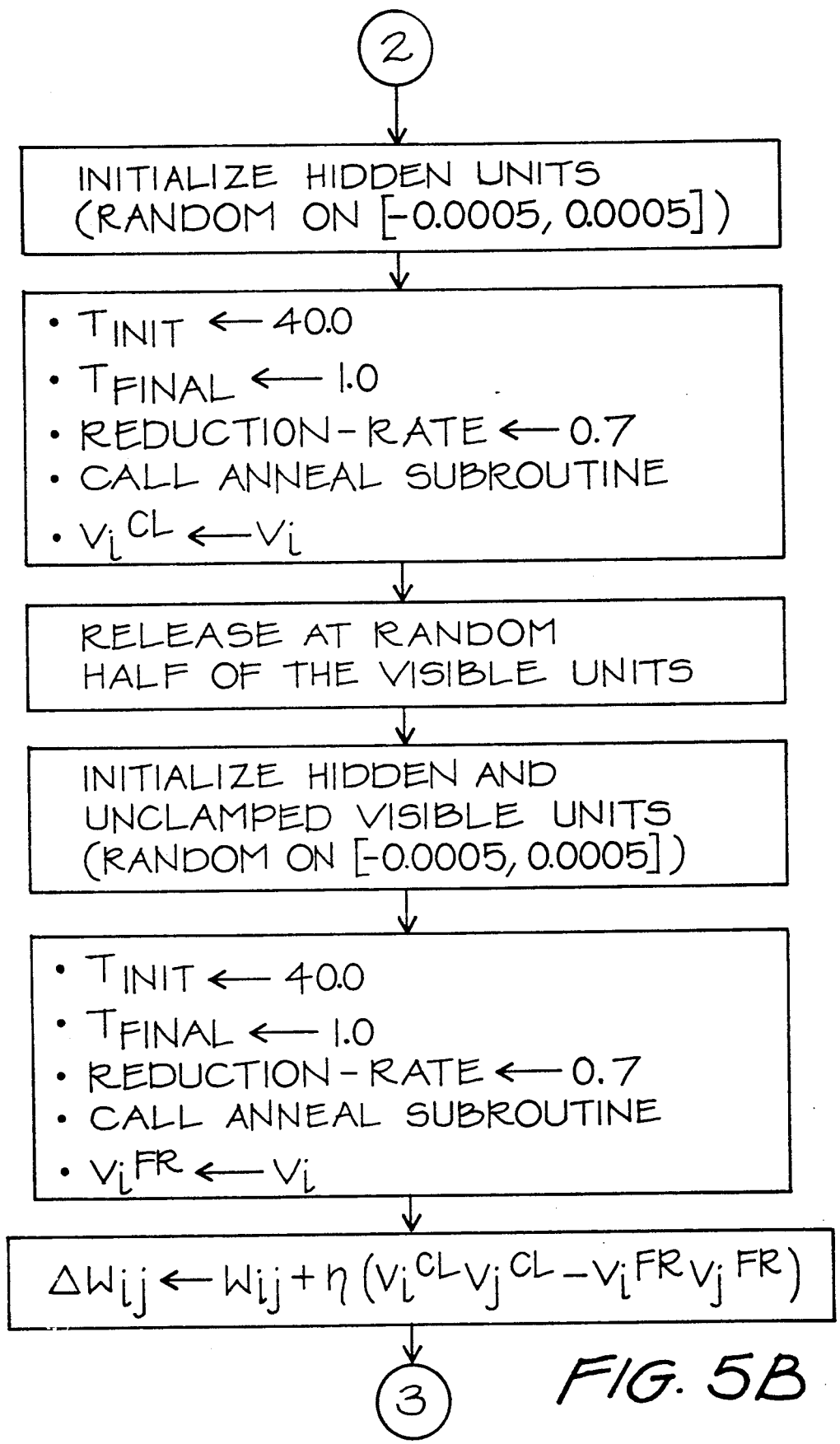
Figure 5C:
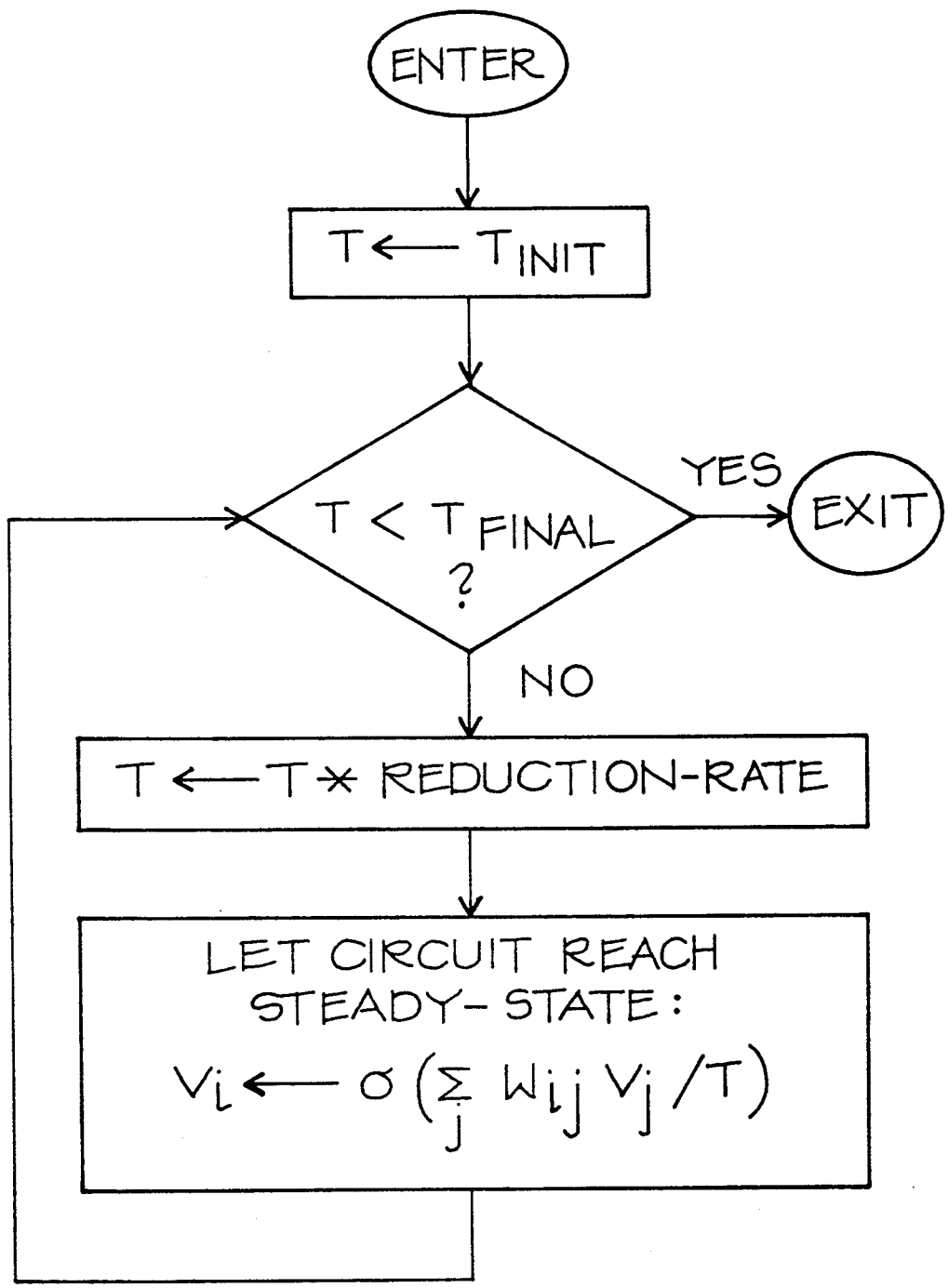
Figure 5D:
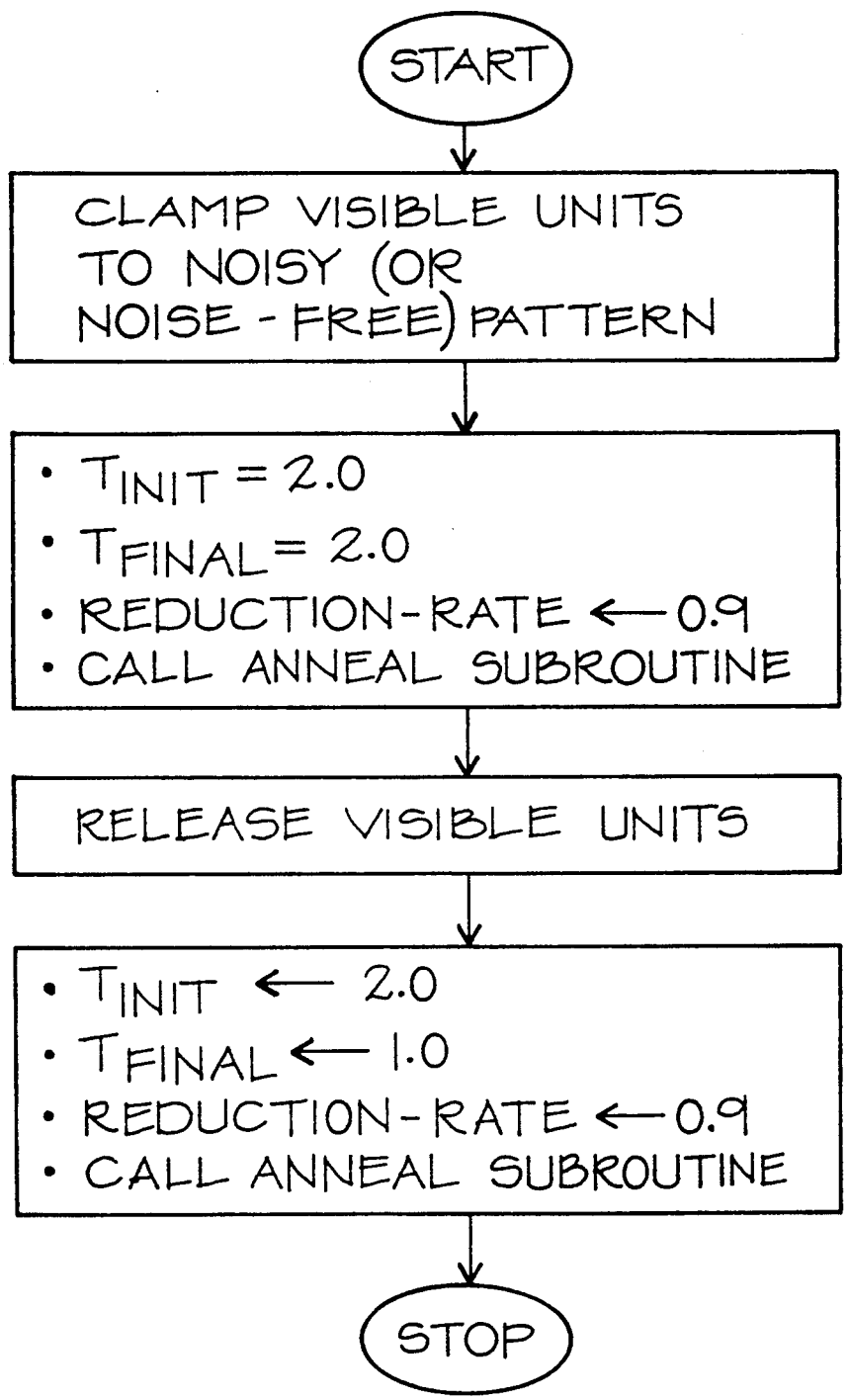

It is certified that error appears in the above-indentified patent and that said Letters Patent is hereby corrected as shown below:

Col. 1, line 21, delete "content addressable" and insert therefor -- content-addressable --.
Col. 1, line 47, delete "best match" and insert therefor -- best-match --.
Col. 3, line 41, delete "=-" and insert therefor -- = --.
Col. 4, line 65, delete "MCC" and insert therefor -- MCC- --.
Col. 5, line 61, delete "FIGS. 3A and 3B are" and insert therefor -- FIG. 3A is --.
Col. 5, line 64, delete "; and" and insert therefor -- and, FIG. 3B is a schematic illustration of the circuitry of the processing units illustrated in FIG. 3A; --.
Col. 5, line 65, delete "are a" and insert therefor -- are separate --.
Col. 5, line 65, delete "illustration" and insert therefor -- illustrations --.
Col. 5, line 68, delete "." and insert therefor -- ; and --.
Col. 6, lines 1-2, delete "FIGS. 5A, 5B, 5C and 5D are a flow chart for the learning algorithm of the present invention." and insert therefor -- FIGS. 5A and 5B are a flow diagram of a learning algorithm and FIG. 5D is a flow diagram of a retrieval algorithm, both of which are used in conjunction with a neural network content-addressable memory in accordance with the present invention, and FIG. 5C is a flow diagram of the annealing subroutine portion of these learning and retrieval algorithms. --.
Col. 7, line 32, delete "FIG. 3. In" and insert therefor -- FIG. 3A --.
Col. 7, line 33, delete "FIG. 3" and insert therefor -- FIG. 3B illustrates that --.
Col. 7, line 33, delete "processor P" and insert therefor -- processor $P_1$ --.
Col. 7, line 38, delete "siqmoidal" and insert therefor -- sigmoidal --.
Col. 7, line 42, delete "as that" and insert therefor -- those --.
Col. 7, line 42, delete "FIG. 4." and insert therefor -- FIGS. 4A and 4B -- .
Col. 8, line 60, after "measure." insert -- FIGS. 5A and 5B set forth a flow diagram of the learning algorithm. FIG. 5C is a flow diagram of the annealing subroutine portion of the learning algorithm.
Col. 9, line 41, after "increases." insert -- FIG. 5D provides a flow diagram of the retrieval algorithm, and FIG. 5C is a flow diagram of the annealing subroutine portion of the retrieval algorithm. --
Col. 9, line 50, delete "η" and insert therefor -- σ --.
Col. 12, line 58, delete "represent" and insert therefor -- represents --.

UNITED STATES PATENT AND TRADEMARK OFFICE
CERTIFICATE OF CORRECTION

PATENT NO. : 5,253,328
DATED : October 12, 1993
INVENTOR(S) : Hartman

It is certified that error appears in the above-indentified patent and that said Letters Patent is hereby corrected as shown below:

Column 1, line 49, delete "reviewed" and insert therefor
— viewed—.

Column 8, line 48, delete "patterns" and insert therefor
—pattern—.

Signed and Sealed this

Thirtieth Day of May, 1995

Attest:

BRUCE LEHMAN

*Attesting Officer*     *Commissioner of Patents and Trademarks*